(12) United States Patent
Nielsen

(10) Patent No.: US 10,734,949 B2
(45) Date of Patent: Aug. 4, 2020

(54) SELF ENABLING SIGNAL CONDITIONER FOR CONDITIONING A CRYSTAL OSCILLATOR OUTPUT SIGNAL INTO A COMPLIANT CLOCK SIGNAL

(71) Applicant: Silicon Laboratories Inc., Austin, TX (US)

(72) Inventor: Peter Østergaard Nielsen, Ishøj (DK)

(73) Assignee: Silicon Laboratories Inc., Austin, TX (US)

( * ) Notice: Subject to any disclaimer, the term of this patent is extended or adjusted under 35 U.S.C. 154(b) by 86 days.

(21) Appl. No.: 16/188,338

(22) Filed: Nov. 13, 2018

(65) Prior Publication Data

US 2020/0153388 A1    May 14, 2020

(51) Int. Cl.
| | |
|---|---|
| *H03B 5/36* | (2006.01) |
| *H03K 3/037* | (2006.01) |
| *H03L 5/00* | (2006.01) |
| *H03L 3/00* | (2006.01) |
| *H03B 5/06* | (2006.01) |
| *H03B 5/12* | (2006.01) |

(52) U.S. Cl.
CPC ............... *H03B 5/364* (2013.01); *H03B 5/06* (2013.01); *H03B 5/12* (2013.01); *H03B 5/1212* (2013.01); *H03B 5/36* (2013.01); *H03K 3/0377* (2013.01); *H03L 3/00* (2013.01); *H03L 5/00* (2013.01); *H03B 2200/0094* (2013.01)

(58) Field of Classification Search
CPC . H03B 5/364; H03B 5/06; H03B 5/36; H03B 5/12; H03B 5/1212; H03L 3/00; H03K 3/0377

USPC .................................... 331/158, 116 FE, 175
See application file for complete search history.

(56) References Cited

U.S. PATENT DOCUMENTS 8,922,288 B2 * 12/2014 Brekelmans ............. H03B 5/36
331/116 FE

OTHER PUBLICATIONS

Wikipedia. "C-element" Downloaded on Aug. 21, 2018 from https://en.wikipedia.org/wiki/C-element pp. 1-8.

* cited by examiner

*Primary Examiner* — Arnold M Kinkead
(74) *Attorney, Agent, or Firm* — Gary Stanford; Huffman Law Group, PC

(57) ABSTRACT

A signal conditioner for conditioning a differential oscillation signal into a compliant clock signal including first and second signal paths and a coincident gate. The first signal path toggles a first binary signal in response to the differential oscillation signal when the differential oscillation signal reaches a small amplitude level. The second signal path toggles a second binary signal in response to the differential oscillation signal only when the differential oscillation signal reaches a large amplitude level that is greater than the small amplitude level. The coincident gate toggles the clock signal high only when the first and second binary signals are both high, and toggles the clock signal low only when the first and second binary signals are both low. When the clock signal begins toggling, it may skip one or more cycles but is nonetheless compliant in terms of timing and amplitude.

20 Claims, 7 Drawing Sheets

SELF ENABLING SIGNAL CONDITIONER FOR CONDITIONING A CRYSTAL OSCILLATOR OUTPUT SIGNAL INTO A COMPLIANT CLOCK SIGNAL

BACKGROUND OF THE INVENTION

Field of the Invention

The present invention relates in general to clock circuits, and more particularly to a self enabling crystal oscillator output signal conditioner for conditioning a differential sinusoidal signal into a timing and level compliant clock signal.

Description of the Related Art

Crystal oscillators are often used to generate a fundamental oscillation signal used for clock sources and clock references for microcontroller units (MCUs) and radio frequency (RF) transceivers and the like. Crystal oscillators, however, are notoriously slow starters due to the high Q of the crystal, and the startup time is often difficult to predict and often influenced by many internal and external factors. A clock driver includes a crystal oscillator and additional supporting circuitry that converts, or otherwise conditions, the oscillation signal into a clock signal. For most applications, it is desired to minimize the elapsed time from when power is applied until the target system can safely operate using the clock signal, which may occur only after the crystal driver provides a timing and level compliant clock signal to the clock input port of the target system.

The fundamental oscillation signal of a crystal oscillator is a differential sinusoidal (analog) signal that gains strength (e.g., increases amplitude) slowly after power up until it reaches a specified signal strength (or specified amplitude). Conventional signal conditioners initially produce noncompliant output signals (e.g., in terms of timing and level or amplitude) while the sinusoidal signal is gaining strength until it reaches the specified signal strength. Operating a target system with a noncompliant clock signal is generally not acceptable. For example, minimum pulse width and/or minimum level violations potentially invalidate the state integrity of the clocked system, which in turn voids its behavioral guarantees. The supporting circuitry may include a signal conditioner along with reset and synchronization circuitry. The reset circuitry generally keeps the system in a reset state after power up until it is guaranteed that the signal conditioner produces a compliant clock signal. In conventional configurations, the reset circuitry incorporates a predetermined delay period having a duration that is guaranteed to be longer than the crystal oscillator startup time. The reset circuitry waits until the delay period has elapsed after power up before de-asserting the reset condition.

Crystal oscillators may have many variables and variations that affect the startup time. A crystal may be selected from among multiple different crystal types and from among different batches of the same type. Many different types of crystal oscillators may be used for a given application with timing variations from one type to the next even for a given crystal. The predetermined delay period therefore had to be longer than the longest possible startup time given the full range of possible variations, variables, and conditions.

SUMMARY OF THE INVENTION

A signal conditioner for conditioning a differential oscillation signal into a compliant clock signal according to one embodiment includes first and second signal paths and a coincident gate. The first signal path toggles a first binary signal in response to the differential oscillation signal when the differential oscillation signal reaches a small amplitude level. The second signal path toggles a second binary signal in response to the differential oscillation signal only when the differential oscillation signal reaches a large amplitude level that is greater than the small amplitude level. The coincident gate toggles the clock signal high only when the first and second binary signals are both high, and toggles the clock signal low only when the first and second binary signals are both low. The clock signal is compliant in terms of timing and amplitude.

The first signal path may include a first set-reset latch that toggles the first binary signal when the differential oscillation signal is at least the small amplitude level, and the second signal path may include a second set-reset latch that toggles the second binary signal only when the differential oscillation signal is at least the large amplitude level. The first set-reset latch may include a first pair of cross-coupled NAND logic gates each in a symmetric CMOS configuration, and the second set-reset latch may include a second pair of cross-coupled NAND logic gates each in an asymmetric CMOS configuration.

The first signal path may include symmetrically configured transistors whereas the second signal path may include asymmetrically configured transistors. The first signal path may be configured with a first propagation delay and the second signal path may be configured with a second propagation delay, in which the second propagation delay is longer than the first propagation delay. Also, a difference between the first and second propagation delays may be selected to ensure that the first and second binary signals do not transition simultaneously. The second signal path may invert the second binary signal relative to the first binary signal. Also, the second signal path may include a delay circuit that ensures that the second binary signal transitions after transitioning of the first binary signal. When the differential oscillation signal reaches the large amplitude level causing jitter of the second binary signal based on a metastable period, the first binary signal may be configured to transitions after expiration of the metastable period.

The coincident gate may be implemented with AND logic gates, a NOR logic gate, and an inverter. The first AND logic gate may have inputs receiving the first binary signal and the clock signal and an output providing a first digital signal. The second AND logic may have inputs receiving the first and second binary signals and an output providing a second digital signal. The third AND logic gate may have inputs receiving the second binary signal and the clock signal and an output providing a third digital signal. The NOR logic gate may have inputs receiving the first, second and third digital signals and an output providing an inverted clock signal. The inverter may have an input receiving the inverted clock signal and an output for providing the clock signal. The coincident gate may also be implemented in a CMOS configuration with NMOS and PMOS transistors.

An electronic system according to one embodiment includes a crystal oscillator that provides a differential oscillation signal, a signal conditioner, and a reset de-assertion synchronizer. The signal conditioner may include a firing circuit, an arming circuit, and a hysteresis flip-flop. The firing circuit may toggle a digital fire signal in response to the differential oscillation signal when the differential oscillation signal reaches a small amplitude level. The arming circuit may toggle a digital arm signal in response to the differential oscillation signal only when the differential oscillation signal reaches a large amplitude level that is greater than the small amplitude level. The hysteresis flip-flop has inputs receiving the digital fire and arm signals and an output for providing the compliant clock signal, in which the hysteresis flip-flop toggles the clock signal high only when the digital fire and arm signals are both high, and toggles the clock signal low only when the digital fire and arm signals are both low. The reset de-assertion synchronizer asserts a synchronous reset signal when an asynchronous reset signal is asserted and de-asserts the synchronous reset signal synchronous with the clock signal after the asynchronous reset signal is de-asserted.

The electronic system may include a target system including at least one system flip-flop having a clock input receiving the clock signal and a reset input receiving the synchronous reset signal. The arming circuit may include an asymmetrically configured latch circuit having a set input receiving a first polarity of the differential oscillation signal, a reset input receiving a second polarity of the differential oscillation signal, and an output that transitions when the set and reset inputs switch state. The arming circuit may invert the digital arm signal relative to the digital fire signal. The arming circuit may also delay the digital arm signal relative to the digital fire signal.

A method of conditioning a differential oscillation signal into a compliant clock signal according to one embodiment includes toggling a first binary signal in response to the differential oscillation signal when the differential oscillation signal reaches a small amplitude level, toggling a second binary signal in response to the differential oscillation signal only when the differential oscillation signal reaches a large amplitude level that is greater than the small amplitude level, and toggling the clock signal high only when the first and second binary signals are both high and toggling the clock signal low only when the first and second binary signals are both low.

The method may include inverting the second binary signal relative to the first binary signal. The method may include delaying the second binary signal relative to the first binary signal. The method may include configuring a first latch circuit in a symmetrical manner to toggle the first binary signal in response to the differential oscillation signal, configuring a second latch circuit in an asymmetrical manner to toggle the second binary signal in response to the differential oscillation signal, and providing a coincident gate that toggles the clock signal in response to the first and second binary signals so that the clock signal transitions high only when the first and second binary signals are both high, and transitions low only when the first and second binary signals are both low. The method may include transitioning the first binary signal after a metastable period of the first binary signal when the amplitude level of the differential oscillation signal reaches the large amplitude level.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventor has recognized the need to provide a compliant clock signal based on a crystal oscillator output in the shortest possible time without the need for a reset delay circuit. He has therefore developed a signal conditioner for conditioning a differential oscillation signal into a compliant clock signal without the need for an extended reset delay. The signal conditioner is self enabling and only toggles the clock signal when compliancy can be achieved. The signal conditioner includes first and second signal paths that toggle corresponding first and second binary signals in response to the differential oscillation signal, in which the first binary signal begins toggling when the differential oscillation signal reaches a small amplitude level, and the second binary signal begins toggling only when the differential oscillation signal reaches a large amplitude level that is greater than the small amplitude level. The second binary signal may be inverted relative to the first binary signal, and also the second binary signal may be delayed relative to the first binary signal. The signal conditioner further includes a coincident gate that toggles the output clock signal only when the first and second binary signals both toggle to the same state. The second binary signal blocks jitter of the first binary signal early in the startup process, and then later in the startup process the jitter-infected second binary signal is used to unblock the jitter-free first binary signal from cycle to cycle. This results in a compliant clock signal as soon as its starts toggling even if one or more cycles are skipped.

Figure 1:
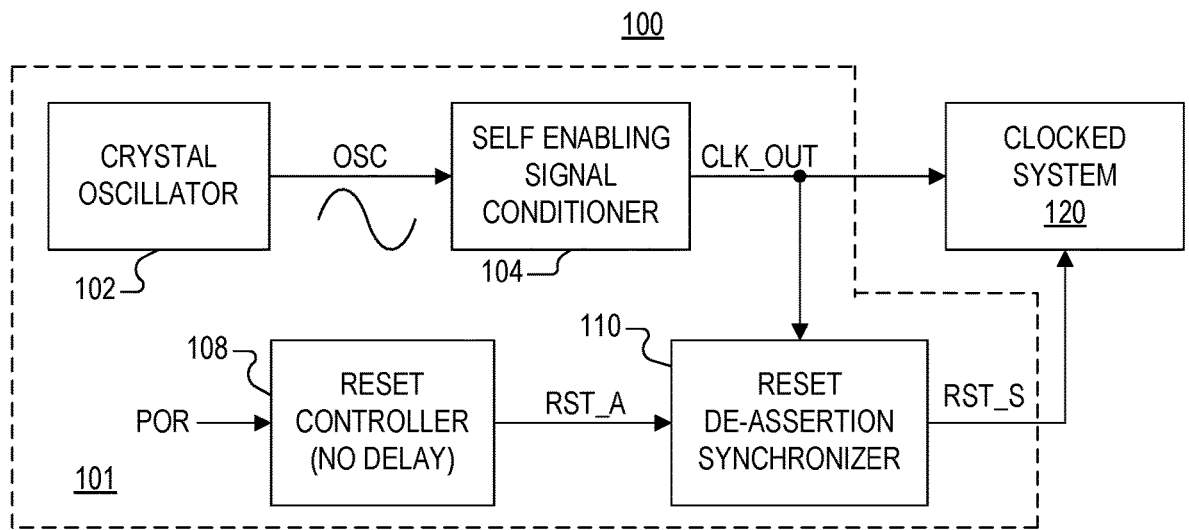
FIG. 1 is a simplified block diagram of an electronic system including a crystal driver and reset circuit which further includes a self enabling signal conditioner implemented according to one embodiment of the present invention.

FIG. 1 is a simplified block diagram of an electronic system 100 including a crystal driver and reset circuit 101 which further includes a self enabling signal conditioner 104 implemented according to one embodiment of the present invention. The crystal driver and reset circuit 101 includes a crystal oscillator 102 that generates a differential sinusoidal oscillation signal OSC provided to an input of the self enabling signal conditioner 104, which provides a compliant clock signal CLK_OUT. A reset controller 108 is responsive to a power-on reset (POR) signal or condition in response to initial application of power or in response to a reset signal or reset condition or the like. The reset controller 108 provides an asynchronous reset signal RST_A to an input of a reset de-assertion synchronizer 110, which also has another input for receiving CLK_OUT. The reset de-assertion synchronizer 110 provides a reset signal RST_S which is asserted when RST_A is asserted and de-asserted after RST_A is de-asserted yet synchronously with CLK_OUT. The electronic system 100 includes a target system 120 having a clock input receiving CLK_OUT and a reset input receiving RST_S.

The system 120 may be or may include any type of analog or digital circuitry requiring a relatively precise clock signal, such as, for example, one or more microcontroller units (MCUs) and/or one or more radio frequency (RF) transceivers and the like. The system 120 may be implemented according to any suitable configuration, such as a system-on-chip (SoC) or the like.

Upon initial power up or startup of the electronic circuit 100 including the crystal oscillator 102, the OSC signal begins to oscillate at a very weak or low amplitude level and builds over time until it reaches a specified strength. In a conventional configuration, a conventional signal conditioner received and attempted to condition the OSC signal into a compliant clock signal provided to the system 120. Nonetheless, the conventional signal conditioner initially provided a noncompliant clock signal that did not meet amplitude or pulse width criteria of the system 120. A noncompliant clock signal that does not meet specified minimum level or minimum pulse-width specifications, if relied upon by the system 120, would potentially invalidate the state integrity of the system 120 which in turn would void its behavioral guarantees.

RST_S, however, remained asserted so that the system 120 was held in reset while the clock signal was noncompliant. In particular, the conventional configuration also included a conventional reset controller that held RST_A, and thus RST_S, asserted for a relatively long delay period so that the noncompliant clock signal was inconsequential to the system 120 since it was held in a reset state. The predetermined delay period of the conventional reset controller ensured that RST_S remained asserted longer than the longest possible startup time of the crystal oscillator 102 under the expected range of variables, variations, and conditions. Eventually, the OSC signal reaches its target signal strength, in which case the conventional signal conditioner was able to provide a compliant clock signal. After expiration of the predetermined delay period, which was well after the OSC signal became compliant, the conventional reset controller de-asserted RST_A and the reset synchronizer de-asserted RST_S synchronously with CLK_OUT, so that the system 120 was able to proceed and operate normally.

In summary of the conventional system, the conventional reset controller was more complex since it included a maximum delay function that delayed startup by a substantial amount to avoid improper operation. The delay function typically had to be empirically determined based on a wide range of expected or possible variations, variables, and conditions, and thus was usually much longer than necessary for most implementations.

The self enabling signal conditioner 104 alleviates this startup problem by producing a glitch-free, minimum pulse width compliant and level compliant clock signal CLK_OUT at the same instant that the OSC signal reaches the sensitivity threshold of signal conditioning. The use of the self enabling signal conditioner 104 significantly simplifies the reset controller 108 since it does not need to incorporate complex delay circuitry. In other words, the reset controller 108 may de-assert RST_A well before OSC has reached the sensitivity threshold of the self enabling signal conditioner 104, since the self enabling signal conditioner 104 only generates compliant transitions of CLK_OUT after OSC has reached a minimum strength level. As soon as CLK_OUT begins transitioning, the reset de-assertion synchronizer 110 synchronously de-asserts RST_S to allow the system 120 to begin normal operation.

The use of the self enabling signal conditioner 104, therefore, eliminates excessive delay and begins operating as soon as CLK_OUT begins generating compliant clock transitions. In this manner, the average startup time is significantly reduced, the need for a matched-delay generator is eliminated, and by eliminating the delay generator, system complexity is significantly reduced. The increased reliability simplifies system testing as well as development since there is no longer any need to determine and implement a maximum delay function. Thus, the reset controller 108 can release the reset any time after POR and before CLK_OUT begins operating. Hence, reset can be released without considering the state of the crystal oscillator 102.

In addition, when CLK_OUT begins operating, it continuously does not violate the minimum-pulse-width constraint. Circuit operation is not compromised even if, upon power up, circuit noise causes a result in loss of one or more pulses of CLK_OUT. The loss of one or more clock pulses does not invalidate the requisite timing constraints nor does it void the benefits described herein. It is further noted that the system state integrity is protected even in the event of any loss of sufficient oscillation amplitude during normal operation. For example, in the event the oscillation amplitude drops below the minimum level, CLK_OUT simply stops toggling until sufficient oscillation amplitude is restored.

Figure 2:
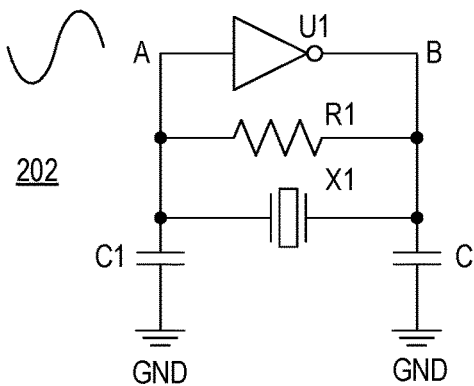
FIG. 2 is a schematic diagram of a conventional Pierce crystal oscillator which may be used as the crystal oscillator of FIG. 1.

FIG. 2 is a schematic diagram of a conventional Pierce crystal oscillator 202 which may be used as the crystal oscillator 102. An inverter U1 has an input coupled to a node A (developing a first oscillation signal A) and an output coupled to a node B (developing a second oscillation signal B) in which the A and B signals are differential polarities of OSC. A resistor R1 and a crystal X1 are both coupled between nodes A and B. A first capacitor C1 is coupled between node A and a reference node, such as ground (GND), and a second capacitor C2 is coupled between node B and GND. The inverter U1 is initially powered off, and then is powered up to begin operation. Upon startup, the circuit begins oscillating and developing differential sinusoidal signals on nodes A and B. The differential sinusoidal signals A and B are 180 degrees out of phase with each other and begin oscillating at a small amplitude. Over time, the amplitudes of both polarities of the differential sinusoidal signal build up until OSC reaches a specified signal strength. The illustrated crystal oscillator 202 is exemplary only and provided only for purposed of illustration. Many different types of crystal oscillators may be used instead as the crystal oscillator 102.

Figure 3:
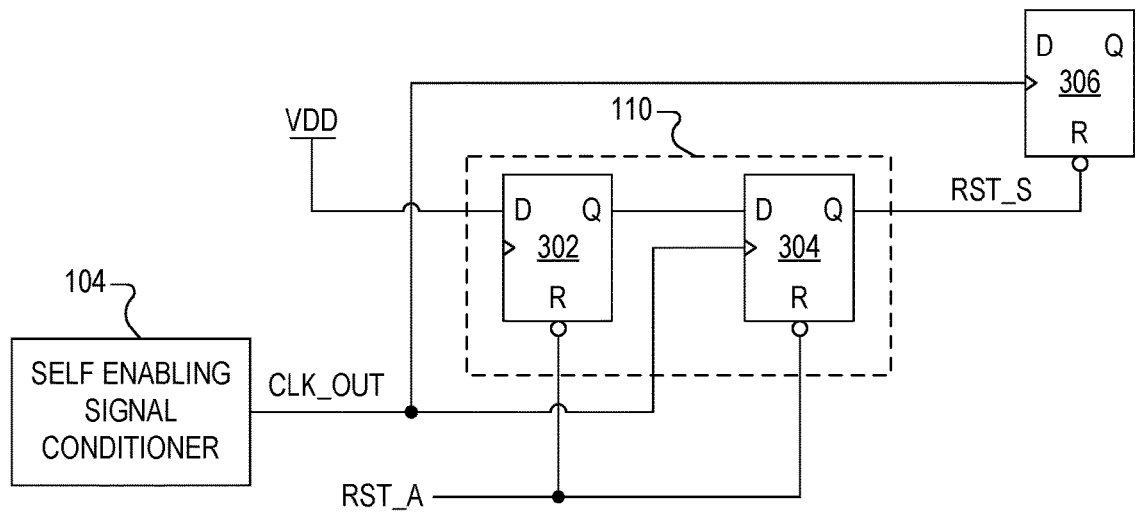
FIG. 3 is a block and schematic diagram of the reset de-assertion synchronizer of FIG. 1 receiving CLK_OUT from the self enabling signal conditioner of FIG. 1.

FIG. 3 is a block and schematic diagram of the reset de-assertion synchronizer 110 receiving CLK_OUT from the self enabling signal conditioner 104. The reset de-assertion synchronizer 110 includes a pair of D-type flip-flops (DFFs) 302 and 304. CLK_OUT is provided to the clock input and RST_A is provided to the reset input of each DFF 302 and 304. The D input of the DFF 302 is pulled high to a source voltage VDD (e.g., a logic one), and the Q output of the DFF 302 is provided to the D input of the DFF 304. The Q output of the DFF 304 provides the RST_S signal to a reset input of a system DFF 306. The system DFF 306 represents any of the flip-flops or other clock-driven and synchronous devices of the system 120. The system DFF 306 has a clock input receiving CLK_OUT.

As soon as RST_A is asserted low (e.g., to a supply voltage reference VSS), the DFF 304 asserts RST_S low with little delay to place the system DFF 306 in reset. When RST_A is next de-asserted high, RST_S is de-asserted high after two cycles of CLK_OUT. When the system is initially powered on, RST_A is initially asserted low causing RST_S to be asserted low to hold the system 120 in reset. The crystal oscillator 102 begins to oscillate so that OSC begins at a very small amplitude that increases over time. Well before OSC reaches a minimum operating amplitude level, RST_A may be de-asserted low early before CLK_OUT begins toggling, which enables both of the DFFs 302 and 304. While CLK_OUT remains static at one state (e.g., high or low), RST_S remains asserted low. As soon as OSC increases to the minimum operating amplitude, the self enabling signal conditioner 104 begins toggling CLK_OUT as further described herein, in which CLK_OUT is a compliant clock signal. In this manner, RST_S is negated high after only two cycles of CLK_OUT to pull the system DFF 306 out of reset. At this time, the system DFF 306 may immediately begin operating successfully according to normal operation since CLK_OUT is a compliant clock signal when toggling. If RST_A is asserted high asynchronously during operation, DFF 306, and thus the entire system 120, is placed back into the reset condition.

Figure 4:
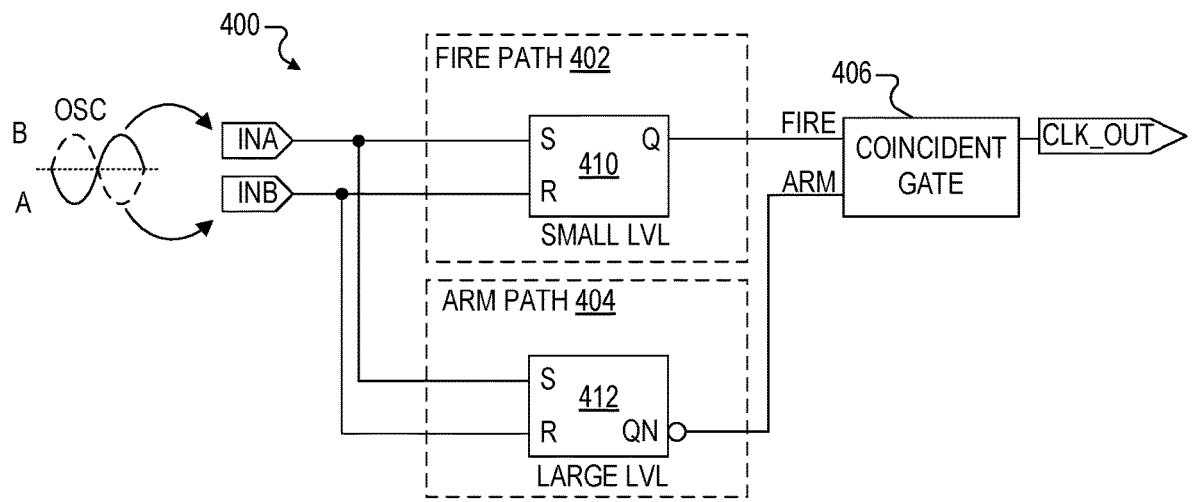
FIG. 4 is a schematic and block diagram of a self enabling signal conditioner implemented according to one embodiment, which may be used self enabling signal conditioner of FIG. 1.

FIG. 4 is a schematic and block diagram of a self enabling signal conditioner 400 implemented according to one embodiment, which may be used self enabling signal conditioner 104 of FIG. 1. The OSC signal is shown as a pair of differential sinusoidal signals A and B, such as generated on the A and B nodes, respectively, of the crystal oscillator 202 or the like. The A signal is provided to an A input (INA) and the B signal is provided to a B input (INB), in which INA and INB are provided to respective inputs of a "fire" path 402 and an "arm" path 404. The fire path 402 generates a binary signal FIRE and the arm path 404 generates a binary signal ARM, in which the FIRE and ARM signals are provided to respective inputs of a coincident gate 406 having an output providing the compliant clock signal CLK_OUT. In the illustrated embodiment, the fire path 402 and the arm path 404 are each implemented with at least one set-reset (SR) latch. As shown, the fire path 402 includes an SR latch 410 having a set input (S) coupled to input INA, a reset input (R) coupled to input INB, and a Q output providing the FIRE signal, and the arm path 404 includes another SR latch 412 having a set input coupled to input INA, a reset input coupled to input INB, and an inverting output QN providing the ARM signal.

Although the arm and fire paths 402 and 404 receive the same differential input signal, the arm path 404 is inverted relative to the fire path 402. Also, the SR latch 410 implementing the fire path 402 toggles at a small signal level (SMALL LVL) of OSC, whereas the SR latch 412 implementing the arm path 404 toggles only at a large signal level (LARGE LVL) of OSC. In particular, the SR latch 410 is configured to begin toggling between binary states as soon as the OSC signal has a relatively small amplitude level, whereas the SR latch 412 is configured to begin toggling between binary states only when the OSC signal reaches a relatively large amplitude level. Various methods may be used to achieve this functionality. In one embodiment, for example, the SR latches 410 and 412 may be implemented using logic gates, such a NOR or NAND gates or the like, in which the logic gates of the SR latch 410 differ in input threshold voltage levels from the logic gates of the SR latch 412. The logic gates may be implemented using transistor devices, such as field-effect transistors (FETs), or MOSFETs (e.g., PMOS and NMOS), or the like, in which different transistor sizes, (such as width versus length dimensions and the like) or different threshold voltages, or any suitable combination of device dimension and threshold voltages may be used to implement small versus large signal levels as further described herein.

Figure 5:
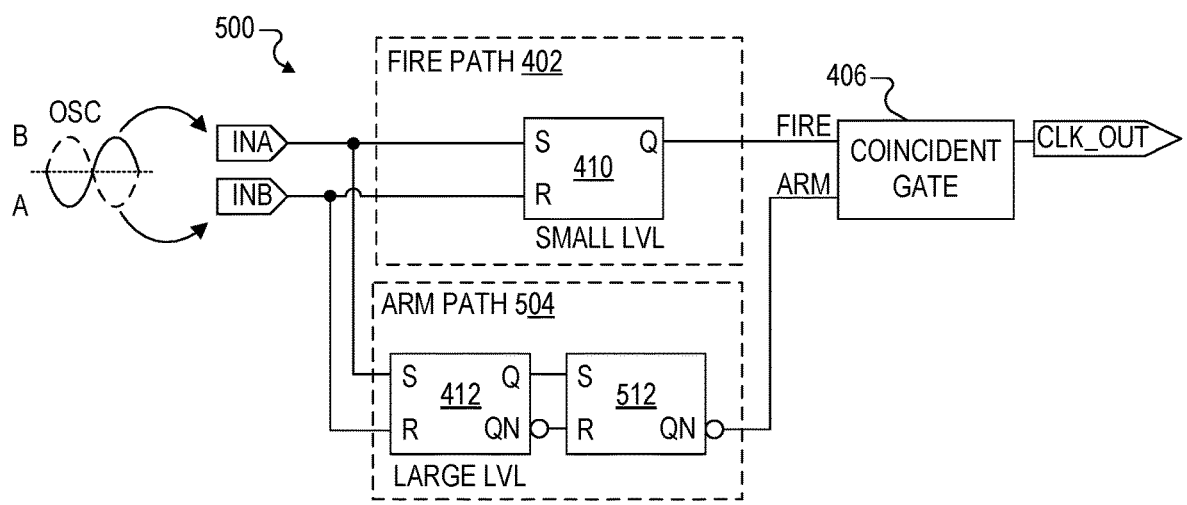
FIG. 5 is a schematic and block diagram of a self enabling signal conditioner implemented according to another embodiment, which may also be used self enabling signal conditioner of FIG. 1.

FIG. 5 is a schematic and block diagram of a self enabling signal conditioner 500 implemented according to another embodiment, which may also be used self enabling signal conditioner 104 of FIG. 1. The self enabling signal conditioner 500 is substantially similar to the self enabling signal conditioner 400, except that the arm path 404 is replaced by an arm path 504. The arm path 504 includes the input SR latch 412 coupled to the inputs INA and INB in similar manner, except that its Q and QN outputs are coupled instead to the set and reset inputs, respectively, of another SR latch 512. The QN output of the SR latch 512 provides the ARM signal to the coincident gate 406, so that the arm path 504 is inverted relative to the fire path 402 in a similar manner as the self enabling signal conditioner 400.

Operation of the self enabling signal conditioners 400 and 500 are substantially similar, except that the signal propagation delay through the arm path 504 is configured to exceed the propagation delay through the fire path 402 in order to guarantee that the FIRE and ARM signals do not transition simultaneously. Although simultaneous transitioning is less likely for sinusoidal signal inputs, the inputs may instead be driven by a digital rail to rail input signal (rather than a crystal oscillator) for purposes of testing or the like. The inclusion of the SR latch 512 ensures that the arm path 504 has a longer propagation delay as compared to the fire path 402. The SR latch 512 may be configured in a similar manner as the SR latch 410. The minimum delay difference between the fire and arm paths 402 and 504 may depend upon the implementation of the coincident gate 406. Also, alternative methods may be used to provide sufficient propagation delay through the arm path 504, such as by adding a simple delay device or series of delay buffers or the like rather than using another latch. Various alternative methods are possible and contemplated.

Figure 6:
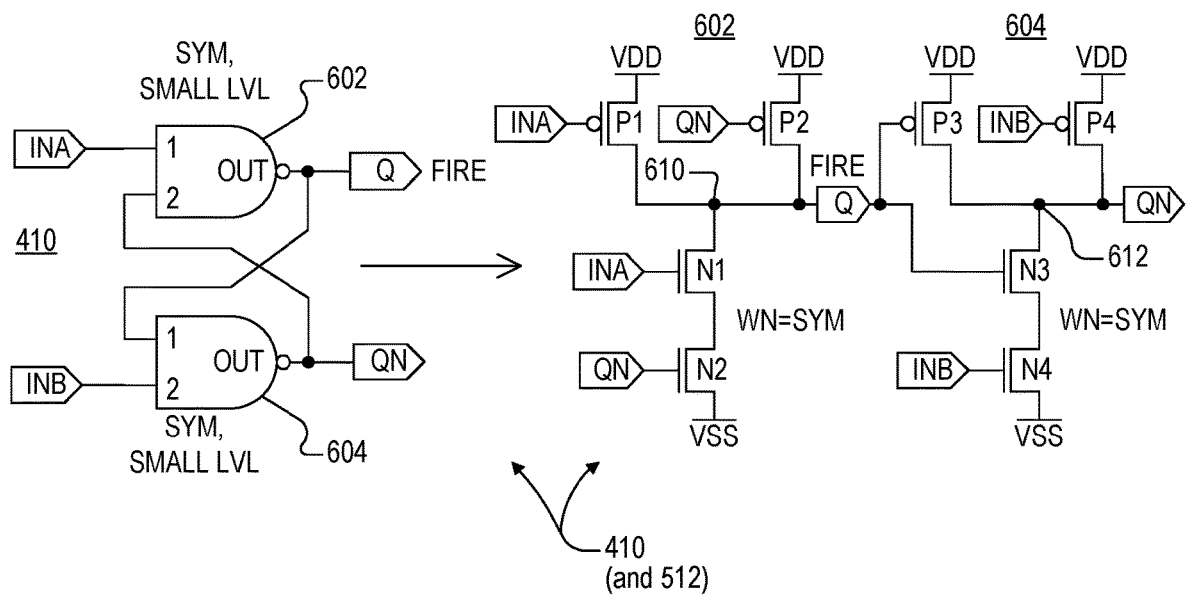
FIG. 6 is a pair schematic diagrams depicting the SR latch of the fire path of FIG. 4 as a logic gate configuration and a corresponding transistor-based configuration according to one embodiment.

FIG. 6 is a pair schematic diagrams depicting the SR latch 410 (and also the SR latch 512) as a logic gate configuration and a corresponding transistor-based configuration according to one embodiment. The logic gate configuration shown on the left side of FIG. 6 is a pair of cross-coupled 2-input logic NAND gates 602 and 604. Input INA is provided to the first input (1) of the NAND gate 602 having its output asserting the FIRE signal as the Q output of the SR latch.

The output of the NAND gate 602 providing the FIRE signal is fed back to the first input (1) of the NAND gate 604, having its second input (2) receiving the input INB and its output providing the QN output (inverting output) of the SR latch. The output of the NAND gate 604 is fed back to the second input (2) of the NAND gate 602.

The NAND gates 602 and 604 may both be configured according to a balanced or symmetrical CMOS configuration (SYM) as described further herein for responding to a small input signal level (SMALL LVL) of OSC. The SR latch 512 may be configured in substantially the same manner as the SR latch 410. A balanced or symmetric configuration means that the FIRE signal begins switching or transitioning when the voltage difference between the differential input signals INA and INB deviate by a relatively small voltage threshold.

The corresponding transistor-based configuration shown on the right side of FIG. 6 includes P-channel MOS (PMOS) type transistors P1 and P2 and N-channel MOS (NMOS) type transistors N1 and N2 implementing the NAND gate 602, and PMOS transistors P3 and P4 and NMOS transistors N3 and N4 implementing the NAND gate 604. P1, P2, P3 and P4 each have a source terminal coupled to a supply voltage VDD. The drain terminals of P1 and P2 are coupled to a node 610 developing the FIRE signal (on the Q output of the SR latch), and the drain terminals of P3 and P4 are coupled to a node 612 forming the QN output of the SR latch. N1 has its drain terminal coupled to node 610 and its source terminal coupled to the drain terminal of N2, having its source terminal coupled to the supply voltage reference VSS. N3 has its drain terminal coupled to node 612 and its source terminal coupled to the drain terminal of N4, having its source terminal coupled to VSS. INA is provided to the gate terminals of P1 and N1, node 612 (QN) is coupled to the gate terminals of P2 and N2, the FIRE signal (Q) is provided to the gate terminals of P3 and N3, and INB is provided to the gate terminals of P4 and N4.

In one embodiment, the PMOS and NMOS transistors implementing the NAND gates 602 and 604 of the SR latch 410 (or the SR latch 512) are configured according to a balanced or symmetric configuration. In one embodiment, for example, the size or the channel widths of the NMOS transistors N1-N4 are selected to corresponding with the corresponding size or channel widths of the PMOS transistors P1-P4. A notation "WN=SYM" denotes that the relative sizes or widths of the NMOS and PMOS transistors are configured according to a symmetrical (SYM) configuration. This means that switching of the FIRE signal occurs when the differential signal asserted between INA and INB is at a relatively small voltage difference from the center voltage between VDD and VSS, or (VDD−VSS)/2. Another method to achieve the symmetrical configuration is to ensure a balance of the threshold voltages of the PMOS and NMOS transistors, or a combination of sizes and threshold voltages for a balanced configuration.

Figure 7:
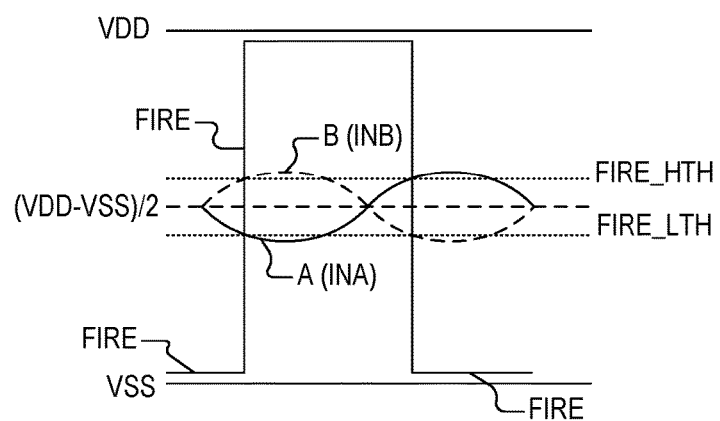
FIG. 7 is a timing diagram illustrating operation of the SR latch of FIG. 6 with a balanced or symmetrical configuration according to one embodiment in response to OSC at a relatively small signal level.

FIG. 7 is a timing diagram illustrating operation of the SR latch 410 with a balanced or symmetrical configuration according to one embodiment in response to OSC at a relatively small signal level. When configured with a balanced or symmetrical configuration, the SR latch 410 implements small signal thresholds for switching of the FIRE signal, shown as a lower threshold voltage level FIRE_LTH and a corresponding upper threshold voltage level FIRE_HTH both relative to the center voltage between VDD and VSS, or (VDD−VSS)/2. The FIRE signal thresholds FIRE_LTH and FIRE_HTH are plotted with dotted lines on either side of the center voltage. OSC is shown as the A signal asserted on input INA (solid line) and the B signal asserted on input INB (dashed line), which are plotted versus time along with the FIRE signal. The A and B signals are shown with relatively small amplitudes, such as occur at the beginning of the startup cycle of the crystal oscillator 102, but sufficiently large to exceed the FIRE signal thresholds FIRE_LTH and FIRE_HTH. Also, FIG. 7 is normalized or simplified as showing signals A and B crossing at the center voltage between VDD and VSS. It is appreciated, however, that the common mode output voltage of the crystal oscillator 102 (or 202) may differ such that A and B cross each other at a somewhat different voltage level. FIRE is shown initially asserted low and the delays of the FIRE signal, including rising and falling edge delays, are omitted for purposes of clarity.

In operation, when A falls below FIRE_LTH while B rises above FIRE_HTH, the SR latch 410 switches to pull the FIRE signal high. After signals A and B cross back over so that A rises above FIRE_HTH while B falls below FIRE_LTH, the SR latch 410 switches again to pull the FIRE signal back low. FIG. 7 illustrates that when the SR latch 410 is configured according to a balanced or symmetric configuration responsive to a small signal level (SMALL LVL) of OSC, it begins switching the FIRE signal early in the startup phase of the crystal oscillator. Although not shown in FIG. 7, earlier in the oscillation cycle the A and B signals have a smaller amplitude. When the amplitude of OSC is smaller than but sufficiently near the FIRE signal thresholds FIRE_LTH and FIRE_HTH, the FIRE signal may being to transition but fail to completely toggle to the opposite state. As the OSC amplitude increases such as just reaching but not exceeding the FIRE signal thresholds, the FIRE signal may begin switching but with significant jitter with variable pulse widths. It is also noted that when FIRE begins transitioning when the OSC amplitude just reaches the FIRE signal thresholds, the amplitude of the FIRE signal may be somewhat attenuated. As the amplitude of OSC continues to increase, the amplitude of the FIRE signal eventually toggles at full amplitude.

Figure 8:
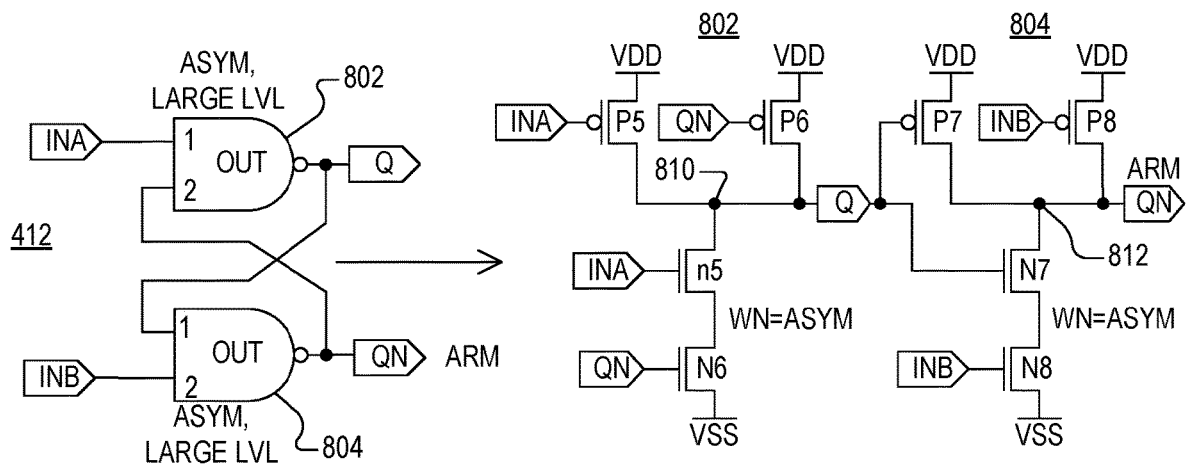
FIG. 8 is a pair schematic diagrams depicting the SR latch of the arm path of FIG. 4 as a logic gate configuration and a corresponding transistor-based configuration according to one embodiment.

FIG. 8 is a pair schematic diagrams depicting the SR latch 412 as a logic gate configuration and a corresponding transistor-based configuration according to one embodiment. The logic gate configuration shown on the left side of FIG. 8 is also shown as a pair of cross-coupled 2-input logic NAND gates 802 and 804. Input INA is provided to the first input (1) of the NAND gate 802 having its output as the Q output of the SR latch 412. The output of the NAND gate 802 is fed back to the first input (1) of the NAND gate 804, having its second input (2) receiving the input INB and its output providing the QN output of the SR latch 412 asserting the ARM signal. The ARM signal is fed back to the second input (2) of the NAND gate 802.

The NAND gates 802 and 804 may be configured according to an unbalanced or asymmetrical CMOS configuration as described further herein for responding to a large input signal level (LARGE LVL) of OSC. An unbalanced or asymmetrical configuration means that the ARM signal begins switching or transitioning when the voltage difference between the differential input signals INA and INB deviate by a relatively large voltage threshold.

The corresponding transistor-based configuration shown on the right side of FIG. 8 includes PMOS transistors P5 and P6 and NMOS transistors N5 and N6 implementing the NAND gate 802, and PMOS transistors P7 and P8 and NMOS transistors N7 and N8 implementing the NAND gate 404. P5, P6, P7 and P8 each have a source terminal coupled to VDD. The drain terminals of P5 and P6 are coupled to a node 810 forming the Q output of the SR latch 412, and the drain terminals of P7 and P8 are coupled to a node 812 forming the QN output of the SR latch 412 developing the ARM signal. N5 has its drain terminal coupled to node 810 and its source terminal coupled to the drain terminal of N5, having its source terminal coupled to VSS. N7 has its drain terminal coupled to node 812 and its source terminal coupled to the drain terminal of N8, having its source terminal coupled to VSS. INA is provided to the gate terminals of P5 and N5, node 812 (QN) developing the ARM signal is coupled to the gate terminals of P6 and N6, the Q output is provided to the gate terminals of P7 and N7, and INB is provided to the gate terminals of P8 and N8.

In one embodiment, the PMOS and NMOS transistors implementing the NAND gates 802 and 804 of the SR latch 412 are configured according to an unbalanced or asymmetrical configuration. In one embodiment, for example, the size or the channel widths of the NMOS transistors N5-N8 may be made relatively large or wide as compared to the size or channel widths of the PMOS transistors P5-P8. A notation "WN=ASYM" denotes that the relative sizes or widths of the NMOS and PMOS transistors are configured according to an symmetrical (ASPM) configuration. For example, the channel widths of the NMOS transistors N5-N8 may be made significantly larger relative to the channel widths of the PMOS transistors. This means that switching of the ARM signal occurs near the outer extents of the voltage range closer to the voltage levels of the supply voltages VDD and VSS with relatively large signal deviation between input signals INA and INB from the OSC signal. Another method to achieve the asymmetrical configuration is to ensure an imbalance of the threshold voltages of the PMOS and NMOS transistors, or a combination of sizes and threshold voltages for an imbalanced configuration.

Figure 9:
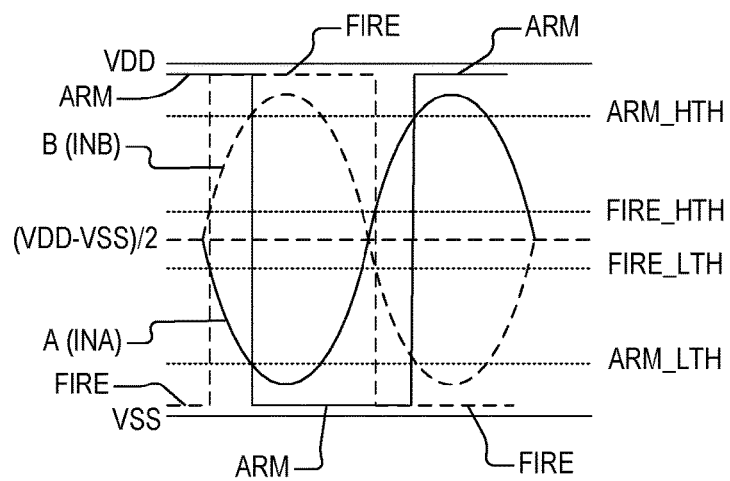
FIG. 9 is a timing diagram illustrating operation of the SR latch of FIG. 8 with an unbalanced or asymmetrical configuration according to one embodiment in response to OSC at a relatively large signal level.

FIG. 9 is a timing diagram illustrating operation of the SR latch 412 with an unbalanced or asymmetrical configuration according to one embodiment in response to OSC at a relatively large signal level. When configured with an unbalanced or asymmetrical configuration, the SR latch 412 implements large signal thresholds for switching of the ARM signal, shown as a lower threshold voltage level ARM_LTH and a corresponding upper threshold voltage level ARM_HTH both relative to the center voltage between VDD and VSS. The ARM signal thresholds ARM_LTH and ARM_HTH are plotted with dotted lines on either side of the center voltage relatively close to the VDD and VSS voltages. OSC is shown as the A signal asserted on input INA (solid line) and the B signal asserted on input INB (dashed line), which are plotted versus time along with the ARM signal. The A and B signals are shown with relatively large amplitudes sufficient to exceed the ARM signal thresholds ARM_LTH and ARM_HTH, such as occur when the amplitude of OSC reaches a minimum operating level. FIG. 9 is normalized or simplified in similar manner as FIG. 7 showing signals A and B crossing at the center voltage between VDD and VSS, in which it is understood that the common mode output voltage may differ. ARM is shown initially asserted high and the delays of the ARM signal, including rising and falling edge delays, are omitted for purposes of clarity.

For purposes of comparison, the FIRE signal is also plotted using dashed lines in FIG. 9 along with the FIRE signal thresholds FIRE_LTH and FIRE_HTH plotted using dotted lines. FIRE is shown initially asserted low and the delays of the FIRE signal, including rising and falling edge delays, are omitted for purposes of clarity.

In operation, when A falls below ARM_LTH while B rises above ARM_HTH, the SR latch 412 switches to pull the ARM signal low. After signals A and B cross back over so that A rises above ARM_HTH while B falls below ARM_LTH, the SR latch 412 switches again to pull the ARM signal back high. FIG. 9 illustrates that when the SR latch 412 is configured according to an unbalanced or asymmetric configuration responsive to a large signal level (LARGE LVL) of OSC, it begins switching the ARM signal later in the startup phase of the crystal oscillator as the amplitude of OSC is larger. Although not shown in FIG. 9, earlier in the oscillation cycle the A and B polarity signals have a smaller amplitude such as shown in FIG. 7. When the amplitude of OSC is smaller than but sufficiently near the ARM signal thresholds ARM_LTH and ARM_HTH, the ARM signal may being to transition but fail to toggle to the opposite state. As the OSC amplitude increases such as just reaching but not exceeding the ARM signal thresholds, the ARM signal may begin switching but with significant jitter with variable pulse widths. When the amplitude of OSC achieves full amplitude, the amplitude of the ARM signal also toggles at full amplitude.

When OSC reaches the larger amplitude level such as shown in FIG. 9, the FIRE signal switches early in each cycle. When A falls below FIRE_LTH and B rises above FIRE_HTH, the SR latch 410 switches to pull the FIRE signal high as previously described. At this point, however, ARM remains asserted high and is only switched low when OSC reaches the ARM signal thresholds. When A falls below ARM_LTH while B rises above ARM_HTH, the SR latch 412 switches to pull the ARM signal low while FIRE remains asserted high. Later in the cycle signals A and B cross-over and when A rises above FIRE_HTH while B falls below FIRE_LTH, the SR latch 410 switches again to pull the FIRE signal back low while ARM remains low. Then, when A rises above ARM_HTH while B falls below ARM_LTH, the SR latch 412 switches again to pull the ARM signal back high. Operation repeats in this manner in subsequent cycles.

FIG. 9 illustrates that when the SR latch 412 is configured according to an unbalanced or asymmetrical configuration and responsive only to large signal variations of the input signal (LARGE LVL), while the SR latch 410 is configured according to a balanced or symmetrical configuration responsive to small signal variations of the input signal (SMALL LVL), once the OSC signal achieves larger amplitudes later in the startup cycle, both of the ARM and FIRE signals switch each cycle in which the ARM signal, which is inverted relative to FIRE, is also delayed relative to FIRE.

The timing diagrams of FIGS. 7 and 9 are simplified in that the switching delays through the respective SR latches are not shown. Even so, if the input A and B signals are instead digital square-wave type of signals rather than the sinusoidal type of signals of OSC, then the delays through SR latches 410 and 412 may be roughly equal in spite of the switching threshold levels. This is undesirable for operation of the self enabling signal conditioner 400 since the FIRE and ARM signals switch at about the same time since the differential digital input signal switches between VSS and VDD. The self enabling signal conditioner 500 alleviates this problem by adding the SR latch 512 to insert additional delay in the arm path 504 so that the ARM signal remains delayed relative to the FIRE signal.

It is noted that although the ARM and FIRE signal thresholds are implemented with a relatively large voltage differential (e.g., ARM_HTH–FIRE_HTH, or FIRE_LTH–ARM_LTH), the thresholds may be closer together. It is desired that any jitter on FIRE is minimized by the time ARM begins transitioning.

Figure 10:
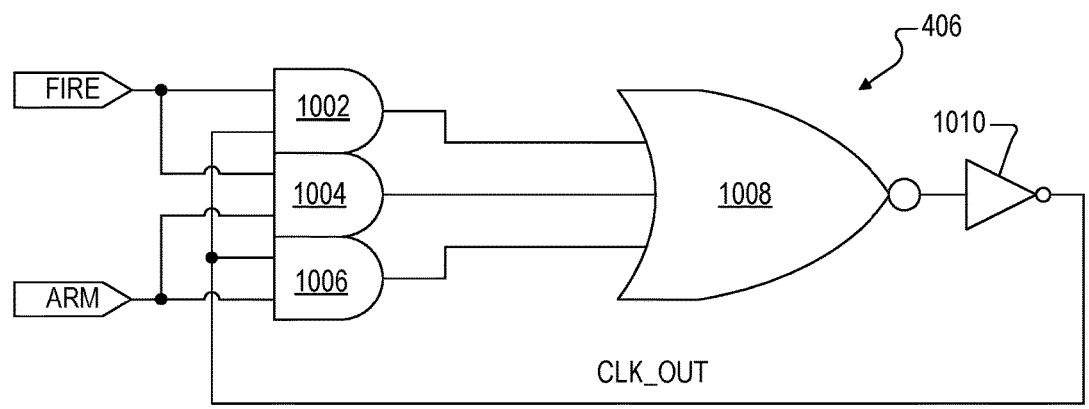
FIG. 10 is a logic level diagram of the coincident gate of FIG. 4 implemented according to one embodiment.

FIG. 10 is a logic level diagram of the coincident gate 406 implemented according to one embodiment. The coincident gate 406 may also be referred to as a Muller C-element, a C-gate, a hysteresis flip-flop, or a coincident flip-flop. The coincident gate 406 includes 3 2-input logic AND gates 1002, 1004, and 1006, a 3-input logic NOR gate 1008, and an output inverter 1010. The FIRE signal is provided to one input of each of the AND gates 1002 and 1004, the ARM signal is provided to one input of each of the AND gates 1004 and 1006, and the output clock signal CLK_OUT is fed back to the remaining inputs of the AND gates 1002 and 1006. The outputs of the AND gates 1002, 1004, and 1006 are coupled to the 3 inputs of the NOR gate 1008, having its output coupled to the input of the inverter 1010 which asserts CLK_OUT at its output.

In operation of the logic level diagram of the coincident gate 406 shown in FIG. 10, CLK_OUT goes high when the FIRE and ARM signals are both asserted high, CLK_OUT goes low when the FIRE and ARM signals are both asserted low, but otherwise CLK_OUT remains unchanged. This also means that when CLK_OUT and FIRE are at the same logic state, CLK_OUT remains unchanged regardless of any toggling of the ARM signal, and, likewise, when CLK_OUT and ARM are at the same logic state, CLK_OUT remains unchanged regardless of any toggling of the FIRE signal.

Figure 11:
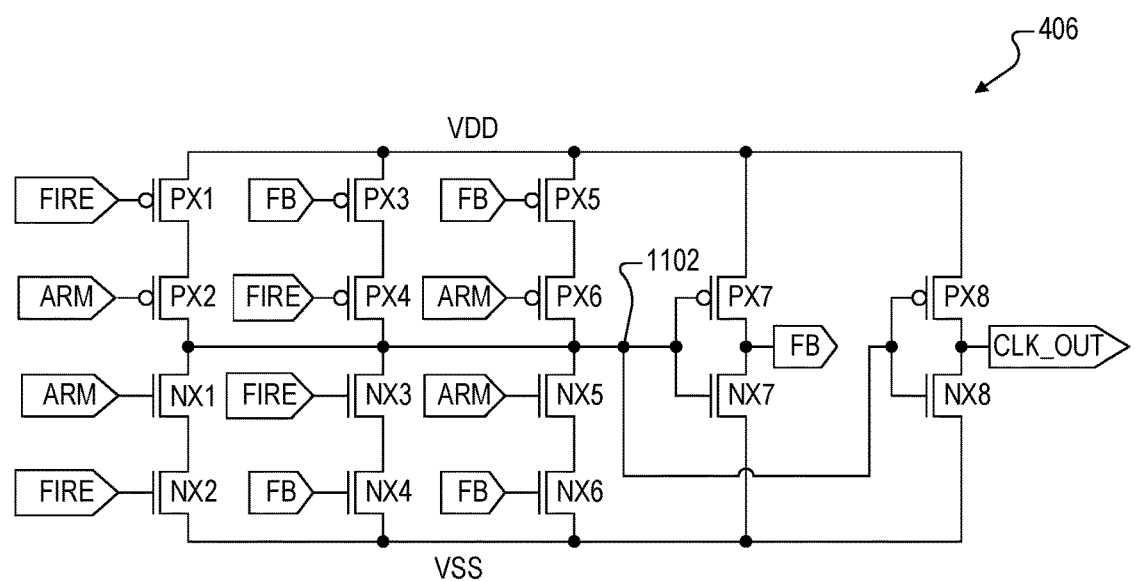
FIG. 11 is a diagram of a CMOS transistor configuration of the coincident gate of FIG. 4 implemented according to one embodiment.

FIG. 11 is a diagram of a CMOS transistor configuration of the coincident gate 406 implemented according to one embodiment. The illustrated CMOS transistor configuration includes 8 PMOS transistors PX1-PX8 and 8 NMOS transistors NX1-NX8. PX1 and PX2 have their current terminals (source and drain terminals) coupled in series between VDD and an intermediate node 1102, PX3 and PX4 have their current terminals coupled in series between VDD and the intermediate node 1102, and PX5 and PX6 have their current terminals coupled in series between VDD and the intermediate node 1102. NX1 and NX2 have their current terminals coupled in series between the intermediate node 1102 and VSS, NX3 and NX4 have their current terminals coupled in series between the intermediate node 1102 and VSS, and NX5 and NX6 have their current terminals coupled in series between the intermediate node 1102 and VSS. PX7 and NX7 have their current terminals coupled in series between VDD and VSS having their gate terminals coupled to the intermediate node 1102. The junction between the drain terminal of PX7 and the source terminal of NX7 are coupled together at a node developing a feedback signal FB. PX8 and NX8 have their current terminals coupled in series between VDD and VSS having their gate terminals coupled to the intermediate node 1102. The junction between the drain terminal of PX8 and the source terminal of NX8 are coupled together at a node developing the output clock signal CLK_OUT. The FIRE signal is provided to the gate terminals of PX1, PX4, NX2 and NX3, and the ARM signal is provided to the gate terminals of PX2, PX6, NX1 and NX5. The FB signal is provided to the gate terminals of PX3, PX5, NX4 and NX6.

Operation of the CMOS transistor configuration of the coincident gate 406 shown in FIG. 11 is substantially the same as described for the logic level diagram of the coincident gate 406 shown in FIG. 10. Again, CLK_OUT goes high when the FIRE and ARM signals are both asserted high, CLK_OUT goes low when the FIRE and ARM signals are both asserted low, but otherwise CLK_OUT remains unchanged.

Figure 12:
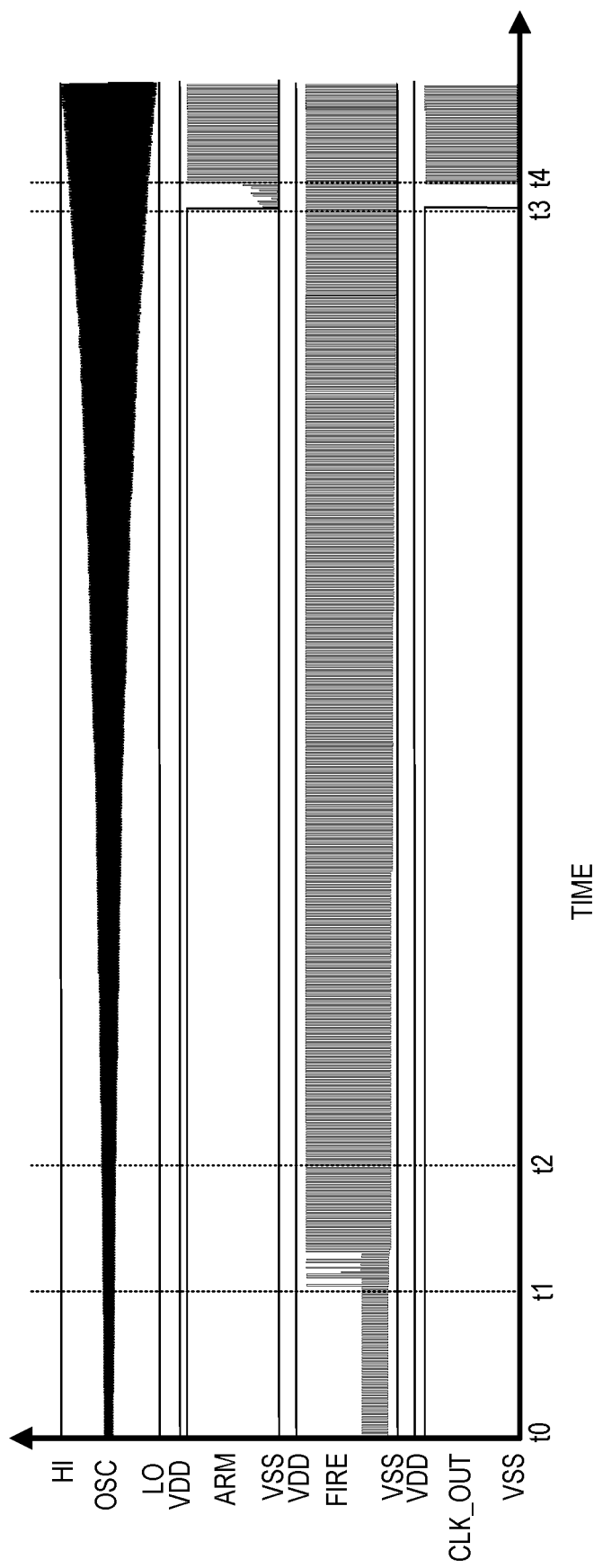
FIG. 12 is a timing diagram illustrating operation of the self enabling signal conditioner of FIG. 5.

FIG. 12 is a timing diagram of the self enabling signal conditioner 500 according to one embodiment, in which the signals OSC, ARM, FIRE and CLK_OUT are plotted versus time. OSC oscillates between high (HI) and low (LO) voltage levels having an amplitude that starts small and increases over time until switching almost at the HI and LO voltage levels. ARM and CLK_OUT are both initially asserted high (at or near VDD) and FIRE is initially low (at or near VSS). At an initial time t0, OSC begins oscillating during an early stage of the startup cycle of the crystal oscillator 102 having a relatively small amplitude. From time t0 to a subsequent time t1, the amplitude of OSC increases but is still less than the FIRE signal thresholds FIRE_LTH and FIRE_HTH, so that the FIRE signal may begin to transition without actually switching each cycle. During this initial time, ARM and CLK_OUT remain unmodified.

At about time t1, the amplitude of OSC just begins to reach the FIRE signal thresholds so that FIRE intermittently toggles high and back low during some cycles. At this time, the FIRE signal may exhibit a significant amount of jitter. From time t1 to a subsequent time t2 as the amplitude of OSC slowly increases, FIRE begins to toggle more regularly at the frequency of OSC. At a subsequent time t2 and thereafter, the amplitude of OSC exceeds the FIRE signal thresholds so that FIRE begins toggling more regularly while its amplitude also slowly increases approaching the VDD and VSS threshold voltages. Since the amplitude of OSC is well below the ARM signal thresholds ARM_LTH and ARM_HTH at t2 up to a subsequent time t3, ARM remains unmodified so that CLK_OUT also remains unmodified because of the operation of the coincidence gate 406. In this manner, any jitter or missed cycles of FIRE during the initial startup period are inconsequential.

Eventually at time t3, FIRE is toggling consistently at full amplitude and the amplitude of OSC begins reaching the ARM signal thresholds ARM_LTH and ARM_HTH. At just about time t3, ARM transitions low and CLK_OUT also transitions low assuming FIRE is also low. However, the ARM signal exhibits significant jitter caused by erratic metastable conditions and does not yet toggle consistently. Although ARM may begin to transition for one or more cycles after time t3, CLK_OUT only transitions in response to complete transitions of both ARM and FIRE according to the function of the coincident gate 406 as previously described. Eventually at a subsequent time t4, the amplitude of OSC ARM exceeds the ARM signal thresholds and begins toggling more consistently. After time t4, CLK_OUT toggles consistently in a compliant manner meeting both level and timing specifications.

In summary, when the amplitude of OSC rises to the FIRE signal thresholds causing FIRE to have significant jitter, all such transitions are blocked by the coincidence gate 406 since the ARM signal remains unchanged. When the OSC signal rises to the ARM signal thresholds, ARM begins to have significant jitter. By this time, however, the FIRE signal toggles consistently and the coincident gate 406 blocks any significant jitter of the ARM signal. The coincident gate 406 operates by allowing the jitter-infected ARM signal to be used as an unblock event for the jitter-free FIRE signal from cycle to cycle. In any given cycle while ARM is jitter-infected, if ARM fails to toggle, then the FIRE signal is blocked, but if ARM does toggle, then the FIRE signal may be passed to toggle CLK_OUT. Thus, toggling of the CLK_OUT signal may skip one or more cycles, but when it toggles, it toggles in a compliant manner by meeting the minimum pulse width and signal level specifications each time it does toggle. In other words, the function of the coincident gate 406 determines when to suppress or pass clock events by looking for unblock confirmations to appear at the output of the arm path 404. The FIRE transitions are strong with low jitter whenever they are allowed to pass due to the asymmetry of the two paths. Weak oscillations on the other hand are blocked because they are not strong enough to trigger unblock events through the arm path 404.

Figure 13:
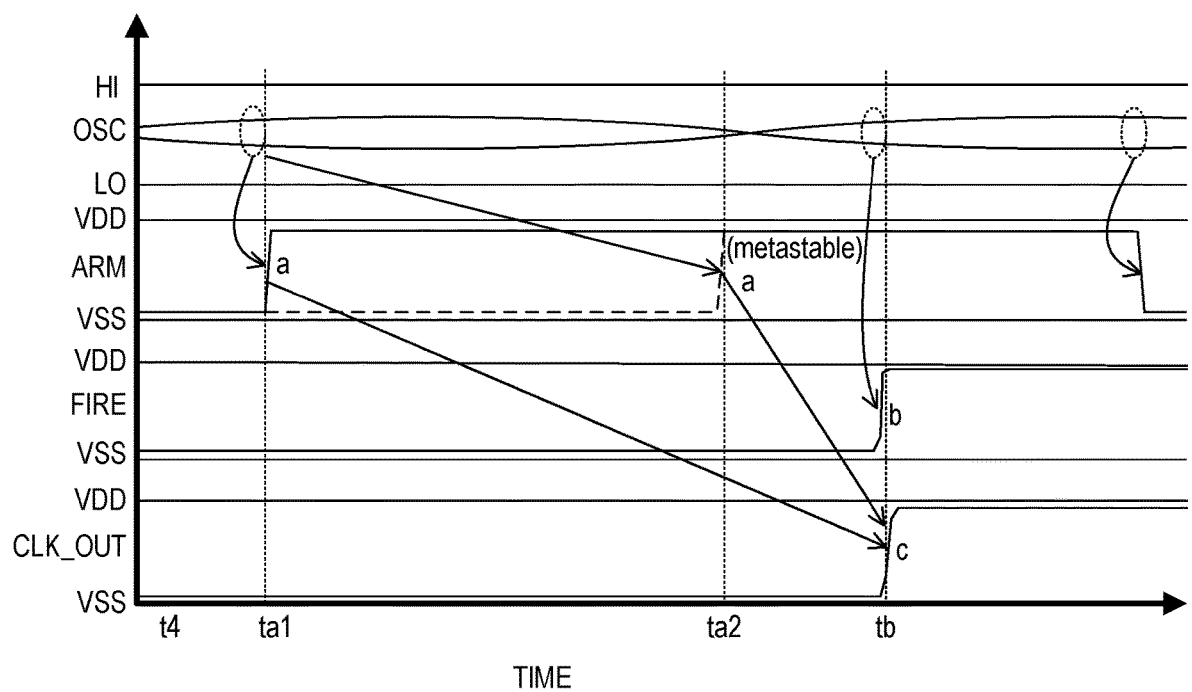
FIG. 13 is a timing diagram illustrating operation of the self enabling signal conditioner of FIG. 5 similar to FIG. 12 but zoomed in to illustrate a single cycle just after the oscillation signal is sufficiently strong to cause the arm signal path to transition.

FIG. 13 is a timing diagram of the self enabling signal conditioner 500 similar to the timing diagram of FIG. 12 in which the OSC, ARM, FIRE and CLK_OUT signals are plotted versus time. FIG. 13, however, is zoomed in to illustrate a cycle just after time t4 when OSC is sufficiently strong to cause ARM to toggle. Just as the amplitude of OSC begins to reach its peak level at this time, ARM may transition between states as soon as a first time ta1 but as late as a second time ta2. The time differential from time ta1 to ta2 represents a metastable condition of ARM causing significant jitter. The FIRE signal, however, does not transition until a subsequent time tb which is designed to occur after time ta2. In this manner, the metastable condition of ARM resolves before FIRE transitions. The relative delay between ARM and FIRE can be adjusted by design to minimize any risk of failure, such as might occur if ARM does not transition until after FIRE has transitioned. The risk of failure is measured by a mean-time-between-failure (MTBF) metric, which may be minimized by design.

It is noted that it may be desired to preserve the duty cycle properties, meaning that the output clock signal CLK_OUT should have the same duty cycle as the input oscillation signal OSC, which is typically very close to 50%. Duty cycle may be preserved when the latches 410, 412 and 512 are designed in a symmetrical manner so that swapping inputs (S and R) and at the same time swapping outputs (Q an QN) results in identical designs. The outputs Q and QN of each latch can also be loaded identically if high accuracy is required. Substantially identical loading can be achieved, for example, by adding dummy loads.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A signal conditioner for conditioning a differential oscillation signal into a compliant clock signal, comprising:
   a first signal path that toggles a first binary signal in response to the differential oscillation signal when the differential oscillation signal reaches a small amplitude level;
   a second signal path that toggles a second binary signal in response to the differential oscillation signal only when the differential oscillation signal reaches a large amplitude level that is greater than said small amplitude level; and
   a coincident gate having a first input receiving said first binary signal, a second input receiving said second binary signal, and an output for providing the clock signal, wherein said coincident gate toggles the clock signal high only when said first binary signal and said second binary signal are both high, and toggles the clock signal low only when said first binary signal and said second binary signal are both low.

2. The signal conditioner of claim 1, wherein said first signal path comprises a first set-reset latch that toggles said first binary signal when the differential oscillation signal is at least said small amplitude level, and wherein said second signal path comprises a second set-reset latch that toggles said second binary signal only when the differential oscillation signal is at least said large amplitude level.

3. The signal conditioner of claim 2, wherein said first set-reset latch comprises a first pair of cross-coupled NAND logic gates each comprising a symmetric CMOS configuration, and wherein said second set-reset latch comprises a second pair of cross-coupled NAND logic gates each comprising an asymmetric CMOS configuration.

4. The signal conditioner of claim 1, wherein said first signal path comprises symmetrically configured transistors and wherein said second signal path comprises asymmetrically configured transistors.

5. The signal conditioner of claim 1, wherein said first signal path is configured with a first propagation delay, wherein said second signal path is configured with a second propagation delay, wherein said second propagation delay is longer than said first propagation delay, and wherein a difference between said first and second propagation delays ensures that said first and second binary signals do not transition simultaneously.

6. The signal conditioner of claim 1, wherein said second signal path inverts said second binary signal relative to said first binary signal.

7. The signal conditioner of claim 6, wherein said second signal path further comprises a delay circuit that ensures that said second binary signal transitions after transitioning of said first binary signal.

8. The signal conditioner of claim 1, wherein when the differential oscillation signal reaches said large amplitude level causing jitter of said second binary signal based on a metastable period, said first binary signal next transitions after expiration of said metastable period.

9. The signal conditioner of claim 1, wherein said coincident gate comprises:
   a first AND logic gate having a first input receiving said first binary signal, a second input receiving the clock signal, and an output providing a first digital signal;
   a second AND logic gate having a first input receiving said first binary signal, a second input receiving said second binary signal, and an output providing a second digital signal;
   a third AND logic gate having a first input receiving said second binary signal, a second input receiving the clock signal, and an output providing a third digital signal;
   a NOR logic gate having inputs receiving said first, second and third digital signals and an output providing an inverted clock signal; and
   an inverter having an input receiving said inverted clock signal and an output for providing the clock signal.

10. The signal conditioner of claim 1, wherein said coincident gate comprises:
   a first pair of PMOS transistors having current terminals coupled in series between a source voltage and an intermediate node and having gate terminals receiving said first and second binary signals;
   a second pair of PMOS transistors having current terminals coupled in series between said source voltage and said intermediate node and having gate terminals receiving said first binary signal and a feedback signal;

a third pair of PMOS transistors having current terminals coupled in series between said source voltage and said intermediate node and having gate terminals receiving said second binary signal and said feedback signal;
a first pair of NMOS transistors having current terminals coupled in series between said intermediate node and a reference node and having gate terminals receiving said first and second binary signals;
a second pair of NMOS transistors having current terminals coupled in series between said intermediate node and said reference node and having gate terminals receiving said first binary signal and said feedback signal;
a third pair of NMOS transistors having current terminals coupled in series between said intermediate node and said reference node and having gate terminals receiving said second binary signal and said feedback signal;
a first CMOS transistor pair comprising a first PMOS transistor having current terminals coupled between said source voltage and a feedback node developing said feedback signal and a first NMOS transistor having current terminals coupled between said feedback node and said reference node, and having gate terminals coupled to said intermediate node; and
a second CMOS transistor pair comprising a second PMOS transistor having current terminals coupled between said source voltage and an output node developing the clock signal and a first NMOS transistor having current terminals coupled between said output node and said reference node, and having gate terminals coupled to said intermediate node.

11. An electronic system, comprising:
a crystal oscillator that provides a differential oscillation signal;
a signal conditioner that conditions said differential oscillation signal into a compliant clock signal, comprising:
    a firing circuit that toggles a digital fire signal in response to said differential oscillation signal when said differential oscillation signal reaches a small amplitude level;
    an arming circuit that toggles a digital arm signal in response to said differential oscillation signal only when said differential oscillation signal reaches a large amplitude level that is greater than said small amplitude level; and
    a hysteresis flip-flop having a first input receiving said digital fire signal, a second input receiving said digital arm signal, and an output for providing said clock signal, wherein said hysteresis flip-flop toggles said clock signal high only when said digital fire signal and said digital arm signal are both high, and toggles said clock signal low only when said digital fire signal and said digital arm signal are both low; and
a reset de-assertion synchronizer having a first input receiving an asynchronous reset signal, having a second input receiving said clock signal, and having an output providing a synchronous reset signal that is asserted when said asynchronous reset signal is asserted and that is de-asserted synchronous with said clock signal after said asynchronous reset signal is de-asserted.

12. The electronic system of claim 11, further comprising a target system including at least one system flip-flop having a clock input receiving said clock signal and having a reset input receiving said synchronous reset signal.

13. The electronic system of claim 11, wherein said arming circuit comprises an asymmetrically configured latch circuit having a set input receiving a first polarity of said differential oscillation signal, having a reset input receiving a second polarity of said differential oscillation signal, and having an output that transitions when said set and reset inputs switch state.

14. The electronic system of claim 11, wherein said arming circuit inverts said digital arm signal relative to said digital fire signal.

15. The electronic system of claim 11, wherein said arming circuit delays said digital arm signal relative to said digital fire signal.

16. A method of conditioning a differential oscillation signal into a compliant clock signal, comprising:
    toggling a first binary signal in response to the differential oscillation signal when the differential oscillation signal reaches a small amplitude level;
    toggling a second binary signal in response to the differential oscillation signal only when the differential oscillation signal reaches a large amplitude level that is greater than said small amplitude level; and
    toggling the clock signal high only when the first and second binary signals are both high, and toggling the clock signal low only when the first and second binary signals are both low.

17. The method of claim 16, wherein said toggling a second binary signal comprises inverting the second binary signal relative to the first binary signal.

18. The method of claim 16, wherein said toggling a second binary signal comprises delaying the second binary signal relative to the first binary signal.

19. The method of claim 16, further comprising:
    configuring a first latch circuit in a symmetrical manner to toggle the first binary signal in response to the differential oscillation signal;
    configuring a second latch circuit in an asymmetrical manner to toggle the second binary signal in response to the differential oscillation signal; and
    providing a coincident gate that toggles the clock signal in response to the first and second binary signals so that the clock signal transitions high only when the first and second binary signals are both high, and transitions low only when the first and second binary signals are both low.

20. The method of claim 16, wherein when the amplitude level of the differential oscillation signal reaches the large amplitude level, said toggling a first binary signal comprises transitioning the first binary signal after a metastable period of the first binary signal.

* * * * *